United States Patent [19]

Proebsting et al.

[11] Patent Number: 4,477,739
[45] Date of Patent: Oct. 16, 1984

[54] MOSFET RANDOM ACCESS MEMORY CHIP

[75] Inventors: Robert J. Proebsting, Richardson; Paul R. Schroeder, Dallas, both of Tex.

[73] Assignee: Mostek Corporation, Carrollton, Tex.

[21] Appl. No.: 402,395

[22] Filed: Jul. 27, 1982

Related U.S. Application Data

[60] Continuation of Ser. No. 270,765, Jun. 5, 1981, , which is a continuation of Ser. No. 970,678, Dec. 18, 1978, , which is a division of Ser. No. 644,854, Dec. 29, 1975, Pat. No. 4,156,938.

[51] Int. Cl.³ .................. H03K 19/096; H03K 19/177
[52] U.S. Cl. .................................... 307/449; 307/463; 365/230
[58] Field of Search ................. 307/449, 463; 365/230

[56] References Cited

U.S. PATENT DOCUMENTS

| | | | |
|---|---|---|---|
| 3,665,473 | 5/1972 | Heimbigner | 307/449 X |
| 3,718,826 | 2/1973 | Donofrio et al. | 307/449 |
| 3,795,898 | 3/1974 | Mehta et al. | 307/449 X |
| 3,801,964 | 4/1974 | Palfi et al. | 307/449 X |
| 4,048,629 | 9/1977 | Bormann | 307/449 X |
| 4,087,704 | 5/1978 | Mehta et al. | 307/449 X |

*Primary Examiner*—Stanley D. Miller
*Assistant Examiner*—David R. Hudspeth

[57] ABSTRACT

A dynamic random access read/write memory having 4,096 binary storage cells is disclosed. The system utilizes a single set of six address input buffers and one decoder for both row and column address information. The memory array includes two 32×64 arrays of dynamic storage cells separated by a row of 64 sense amplifiers each having split sense buses or digit lines extending to each column of memory bits. The decoders are disposed along one edge of the array which is at right angles to the row of sense amplifiers. The column enable lines from the decoders extend through the memory array between parallel row enable lines and then turn and proceed as a different level of interconnect between parallel digit lines to select the addressed sense amplifiers. Each column enable line enables two sense amplifiers which simultaneously read data from two cells of the addressed row. The least significant bit of the six column address inputs is used to make the final one out of two selection of the sense amplifier and thus the cell from which data is to be read or in which data is to be written. The decoder includes circuit means for storing the decode signal identifying a selected row while subsequent column address signals are input to the chip and decoded by the same decoder. Row address data is first input through the six address pins to the chip; the six inputs are sampled and latched in six address buffers; and the six address inputs are then decoded so that a single row enable line is selected and held active dynamically. Then while data is read from all storage cells in the active row by the sense amplifiers, column address signals applied to the same input pins for the chip are sampled and latched in the same six address buffers, and decoded by the same decoder to select and hold a column enable line active.

5 Claims, 7 Drawing Figures

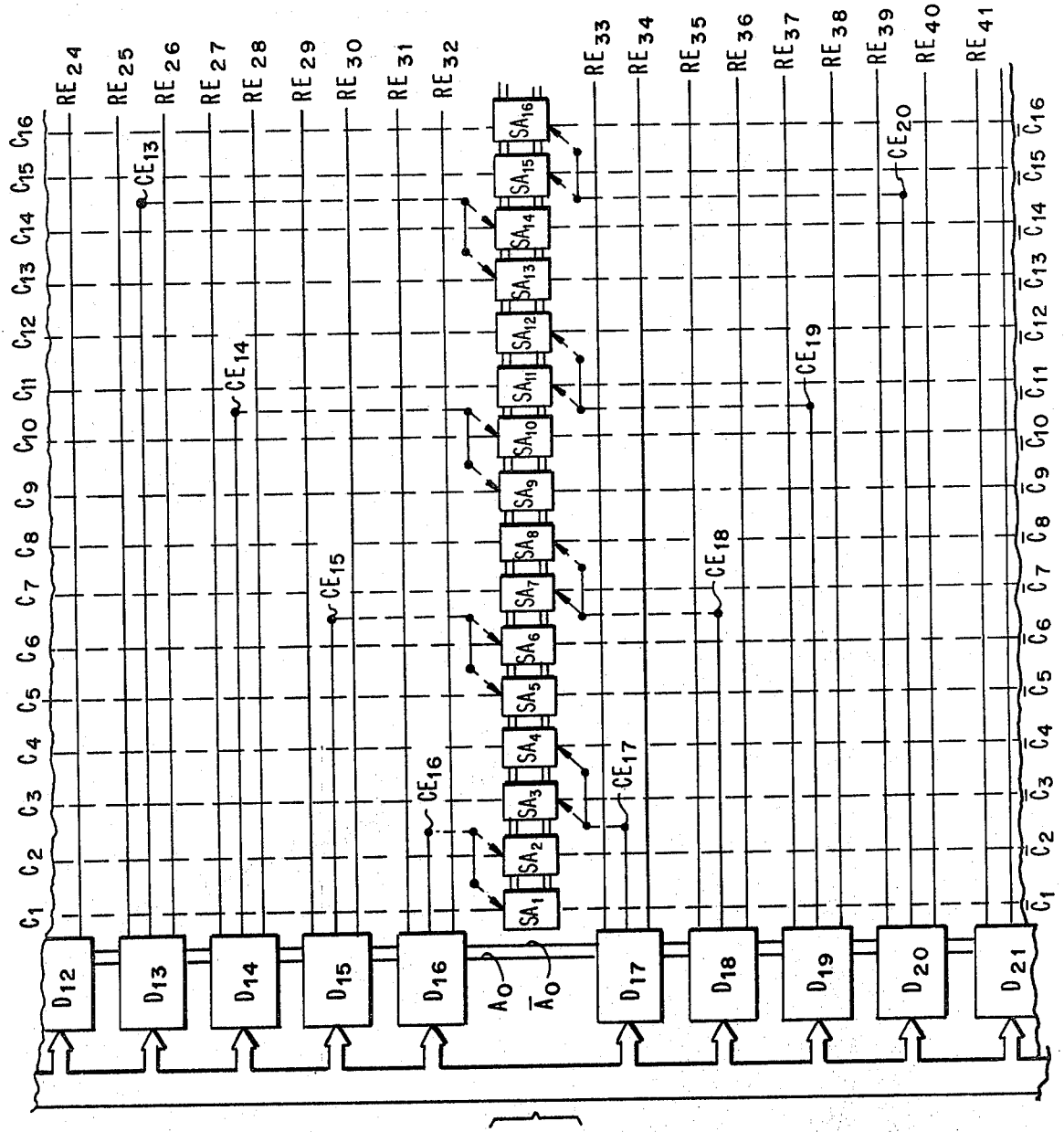
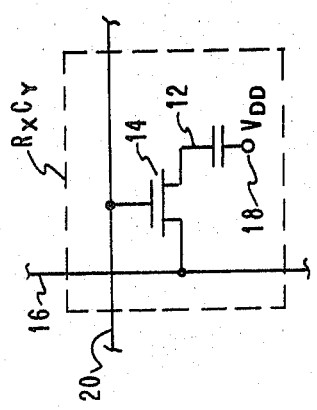
FIG. 6
FIG. 2

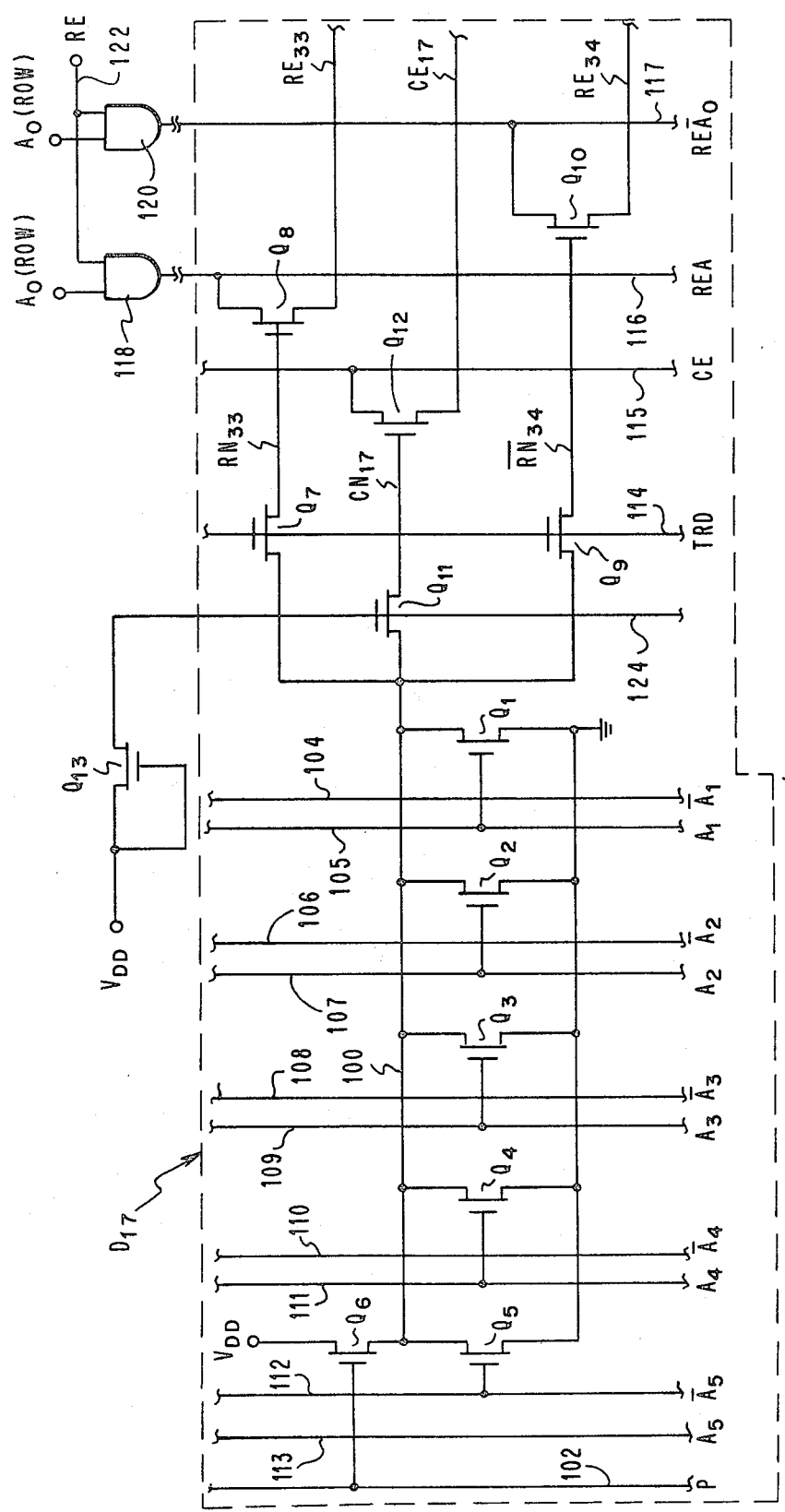
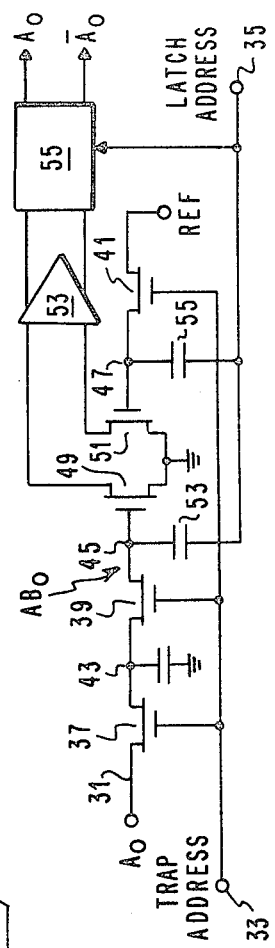
FIG. 3
FIG. 7

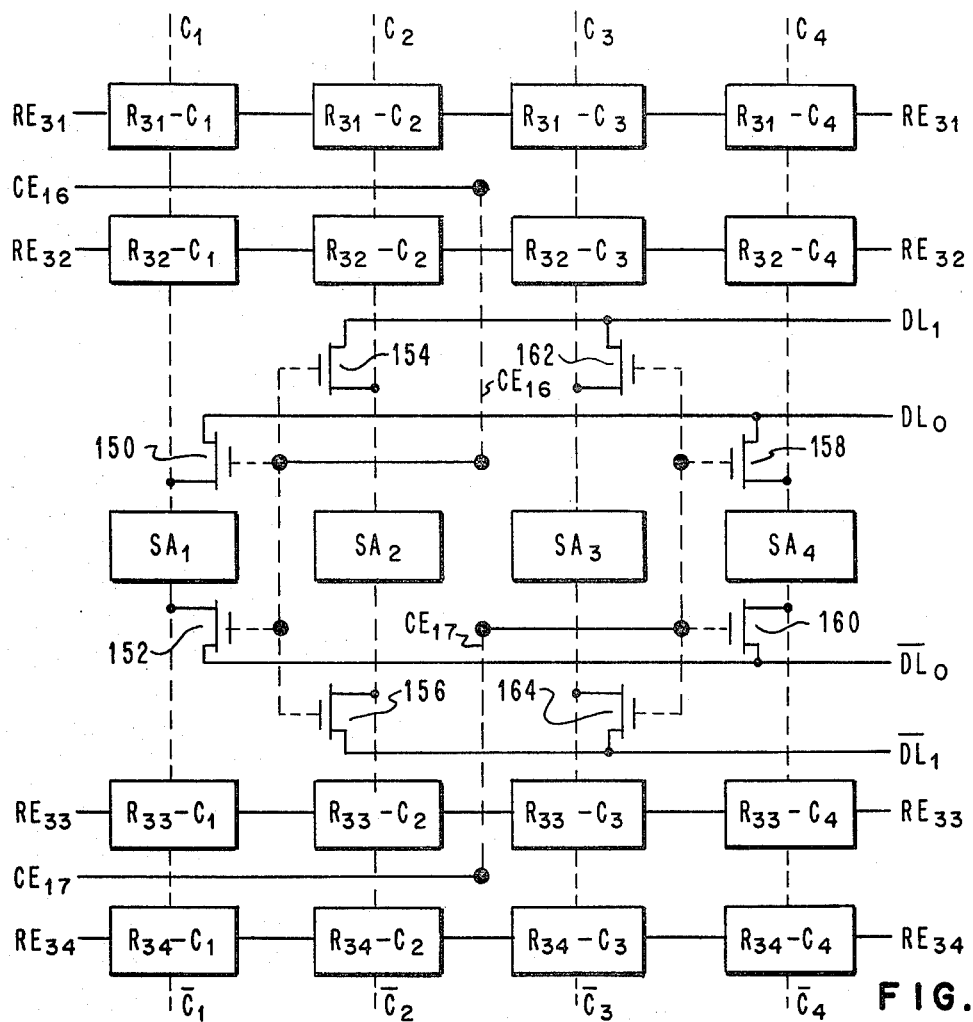
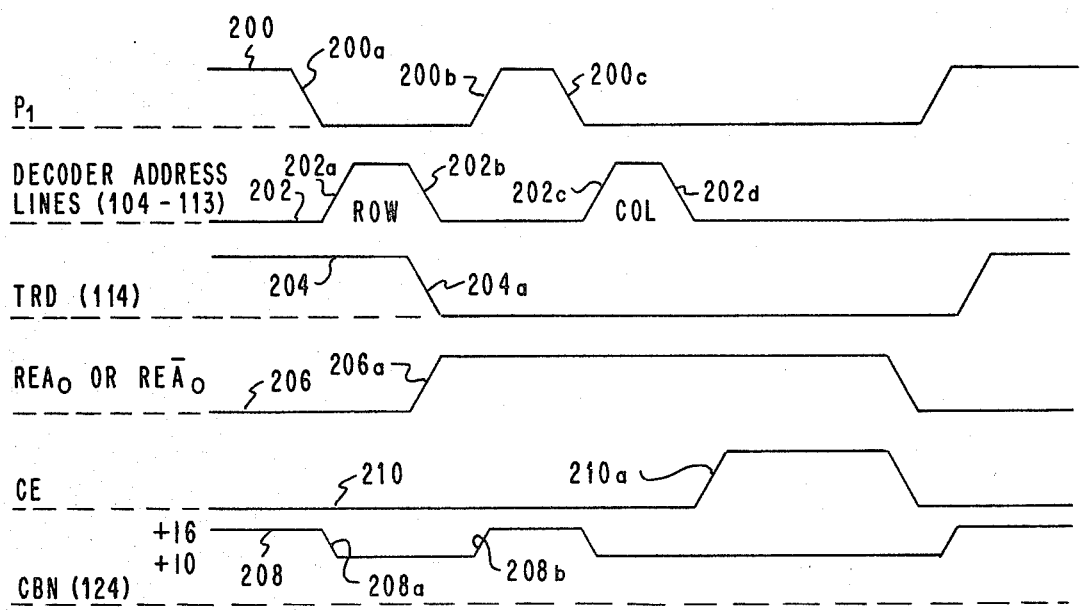
FIG. 4
FIG. 5

MOSFET RANDOM ACCESS MEMORY CHIP

This is a continuation, of application Ser. No. 270,765, filed June 5, 1981 is a continuation of application Ser. No. 970,678, filed Dec. 18, 1978 which is a divisional of application Ser. No. 644,854, filed Dec. 29, 1975, now U.S. Pat. NO. 4,156,938.

This invention relates generally to integrated semiconductor circuits, and more particularly relates to random access memories of the type most conveniently fabricated using MOSFET technology.

Large scale integrated circuits have been used increasingly in recent years for storing digital data in random access memories having both read and write capability, as well as read only capability. In this type of circuit, binary address signals are applied from external control circuitry to the integrated circuit chip to identify a single binary memory cell in an array of several thousand. A large number of these integrated circuit chips are typically connected in parallel in a memory system with corresponding inputs common, except for one input which provides a method of selecting only one chip. In order to achieve maximum utility, the number of control signals to the chip is preferably reduced to a minimum by providing for automatic data processing within each individual integrated circuit chip. For economic reasons, it is also highly desirable to provide the greatest number of binary storage cells possible on a single integrated circuit chip. Attempts to increase the number of storage cells on each chip has heretofore increased the number of external connections to the chip, thus increasing the "pin count" of the package. The combination of the increased storage capacity and greater chip area and the requirement for a package having greater pin count materially increases the cost of the circuit because of greater material cost and reduced yields.

Random access read/write memories having 4,096 storage cells arrayed in 64 rows and 64 columns have been commerically produced. In order to specifically identify a single storage cell, twelve binary address signals are required, six to select a row and six to select a column. It is generally necessary to use nine pins to input data, control operation of such a circuit, and provide power, resulting in a required total of 21 pins. As a result, a 22 pin package has been used. Some desirable control and power supplies have been omitted to reduce the numbers of pins to eighteen but this type circuit requires many compromises. Using current semiconductor technology, a read/write random access memory having 16,384 binary storage cells on a single chip is feasible, but this increases the number of address inputs required by two.

In co-pending U.S. application Ser. No. 513,091, now U.S. Pat. No. 3,696,706 entitled "Dynamic Random Access Memory MISFET Integrated Circuit", filed Oct. 8, 1974, by Robert J. Proebsting, and assigned to the assignee of the present invention, which application is hereby incorporated herein by reference, a 4,096 bit random access read/write memory is disclosed and claimed which utilizes only a sixteen pin package. This is made possible by using the same six pins for both the row address and column address inputs to the package. This is made practical by using a separate column address strobe signal to place the column select function under the control of the external central control system. However, this circuit utilized separate input buffers for the row address signal and for the column address signals, and also separate row and column decode circuits disposed along adjacent edges of the memory array. The number of storage cells in this circuit can be increased to 16,384 which will retain a sixteen pin package merely by using the chip select pin as the seventh address input and externally decoding either the row or column address strobe signal to provide the chip select function.

The random access memory in accordance with the present invention utilizes a single set of address input pins, a single set of sampling input buffers, and a single decoder to sequentially receive both row and column address signals. The decoder includes the capability to store the adddressed row at a row storage node in order to maintain selected row active and automatically access all cells in the row while the input buffers and the decoder are used for one or more column address cycles during which the active row remains selected.

The present invention is concerned with a circuit having the same number of binary storage cells, either 4,096 or 16,384, and having the same functional capabilities as the above described circuit in a sixteen pin package, yet which utilizes a chip of significantly reduced area. The circuit is therefore less expensive to fabricate by reason of the increased number of chips per wafer and also by the increased yield resulting from the smaller chip size. Additionally, the circuit is fabricated using simpler, less expensive processing and has a considerably shorter access time.

More specifically, the present invention utilizes a number of binary storage cells arrayed in rows and columns, preferably equal in number. A decoder is disposed along one edge of the array at the ends of the rows, and a sense amp is provided for each column, with the sense amps aligned perpendicular to the decoder. The decoder has a row enable output for each row and a column enable output for each pair of columns. The row enable lines from the decoders extend parallel to the rows across the array. The column address lines extend between the row enable lines until reaching their corresponding columns, and then interconnect to a different level of conductor in the circuit and extend at right angles to the rows to their respective sense amplifiers.

In a specific embodiment of the invention, the array is divided into equal halves with a row of sense amplifiers extending between the halves of the memory array and parallel to the rows, thus permitting the use of balanced, split sense lines. The decoder is disposed at one end of the row of sense amplifiers and the column address lines extend from opposite halves of the storage cell arrays toward the sense amps. Only thirty-two decode units are used in the decoder, with each decoder producing two row enable outputs and one column enable output, although other combinations are possible.

Even more specifically, each of the thirty-two column enable lines then address two sense amplifiers. Two pairs of data lines extend parallel to the sense amps, with each pair going to separate read/write amplifiers, which are then multiplexed by the least significant bit of the column address inputs. Similarly, the two row enable outputs from the thirty-two decoders are multiplexed at the output of the decoder by the least significant row address bit.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

FIG. 2 is a schematic diagram of a portion of the circuit illustrated in FIG. 1;

FIG. 3 is a schematic circuit diagram of one of the decode circuits illustrated in FIG. 2;

FIG. 4 is a more detailed schematic diagram of a portion of the circuit illustrated in FIG. 2;

FIG. 5 is a timing diagram which serves to illustrate the operation of the portion of the circuit illustrated in FIG. 3;

FIG. 6 is a schematic circuit diagram illustrating a typical storage cell from the circuit of FIG. 1; and FIG. 7 is a schematic circuit diagram illustrating an input buffer of the circuit of FIG. 1.

Figure 1:
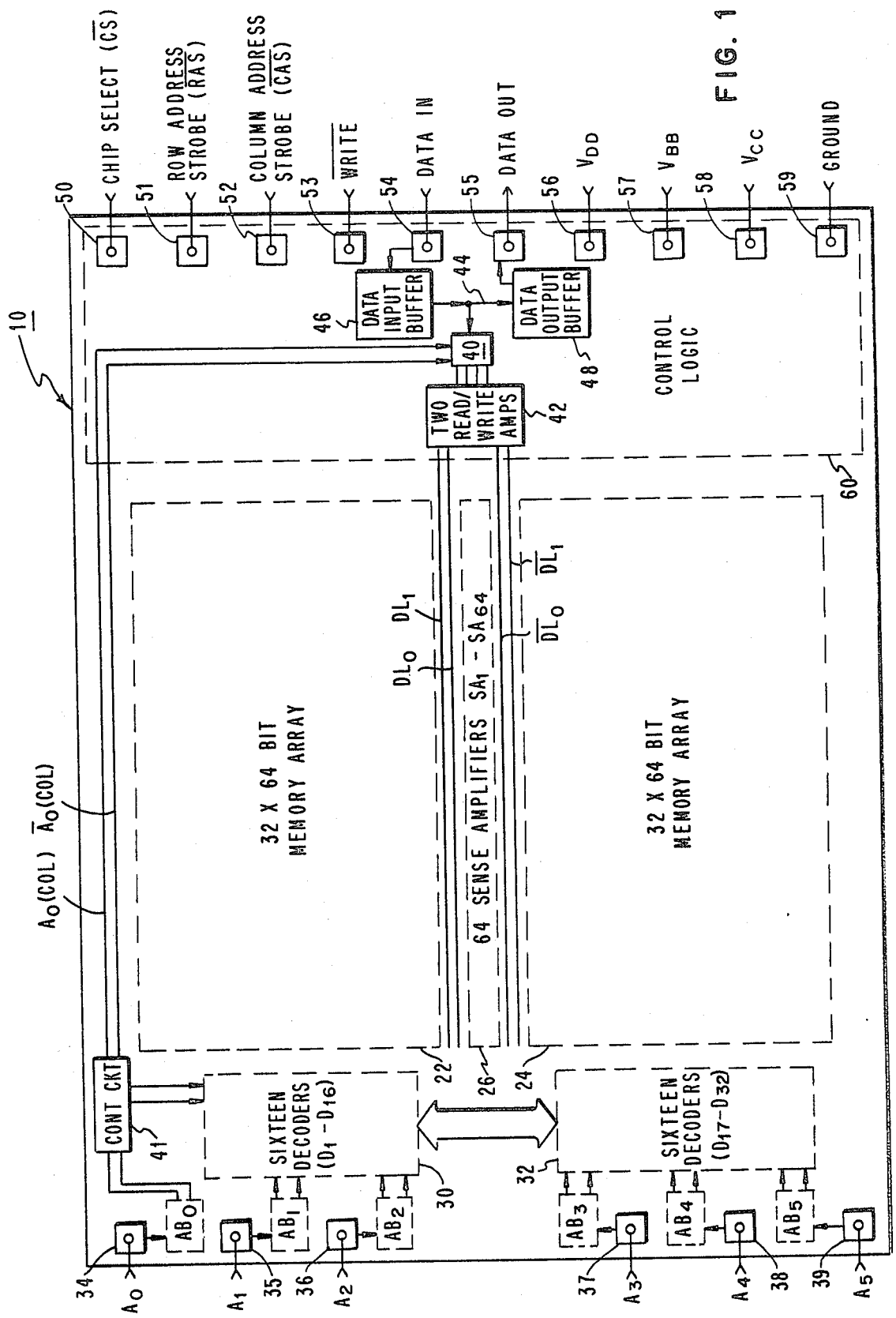
FIG. 1 is a schematic plan view of an integrated circuit chip in accordance with the present invention.

Referring now to the drawings, an integrated circuit chip in accordance with the present invention is indicated generally by the reference numeral 10 in FIG. 1, where the dimensions of the chip 10 are shown substantially to scale in FIG. 1. The circuit includes 4,096 memory cells of the type illustrated in FIG. 6. Each of these memory cells includes a capacitive storage node 12 and a field effect transistor 14 which are connected between a digit line 16 and the circuit supply voltage 18, a row enable line 20 is connected to the gate of the transistor 14. Data is stored by bringing the row enable line 20 high to turn transistor 14 on, and then bringing digit line 16 to the desired voltage, either 0 volts for a logic "0" level or some positive voltage for a logic "1" level, on storage node 12, then turning the row enable line 20 off. Data is read from the storage cell by precharging line 16 to some predetermined voltage, then bringing the row enable line 20 high to turn transistor 14 on, and then sensing a voltage change on the digit line 16, the magnitude of the change being representative of whether a logic "1" or a logic "0" was stored in the cell. For convenience, these cells are designated by row and column as $R_xC_y$ where x is the row and y is the column. For example, cells in the first row are designated $R_1C_1$ through $R_1C_{64}$ and the cells in the first column are designated $R_1C_1$ through $R_{64}C_1$, although only the cells common to rows 31-34 and columns $C_1$-$C_4$ are illustrated specifically in FIG. 4.

As mentioned, a total of 4,096 storage cells similar to those illustrated in FIG. 6 are provided on the chip 10. If desired 16,384 cells can also be provided. One-half of the storage cells are located in the area defined by the dashed line 22 in FIG. 1, and the other half in the area bounded by the dashed line 24. The storage cells in area 22 are arrayed in 32 parallel rows extending horizontally in FIG. 1 and 64 columns extending vertically. Similarly, the cells in array 24 are arrayed in 32 horizontal rows and 64 vertical columns. Sixty-four amplifiers, one for each vertical column, are disposed between the two arrays of memory cells within the dotted area bounded by dashed line 26. The sense amplifiers are designated $SA_1$-$SA_{64}$, with enlarged portions being illustrated in FIGS. 2 and 4 as will presently be described. An important advantage of this invention is that balanced dynamic sense amplifiers with split sense lines of the type described and claimed in co-pending U.S. application, Ser. No. 664,857, now U.S. Pat. No. 4,061,999, entitled "Dynamic Random Access Memory", filed on the same date as the present application by Robert J. Proebsting and Paul R Schroeder, and assigned to the assignee of the present application, can be used, and this application is hereby incorporated herein by reference. This dynamic sense amplifier requires direct access to both halves of the selected column, and the decode method herein disclosed provides such access. Thus, each of the sense amps $SA_1$-$SA_{64}$ has true and complement digit lines, or sense buses, which are designated $C_1$-$C_{64}$ and $\overline{C}$-$\overline{C}_{64}$, although only the first sixteen pairs of the digit lines are illustrated in FIG. 2.

Sixteen decoder circuits $D_1$-$D_{16}$ are disposed in the area defined by dashed line 30, and sixteen decoder circuits $D_{17}$-$D_{32}$ are located in the area defined by dashed line 32. Six address inputs $A_0$-$A_5$, which are schematically illustrated as wires ball bonded to metalized pads 34-39, respectively, are connected to six address buffers $AB_0$-$AB_5$ disposed substantially in the areas indicated by the corresponding dashed lines. Each of the buffers $AB_0$-$AB_5$ is preferably of the sample and hold type and produce true and complement address signals. More specifically, the address buffers $AB_0$-$AB_5$ are preferably of the type described in co-pending U.S. application Ser. No. 644,856, now U.S. Pat. No. 4,096,402, entitled "MOSFET Buffer for TTL Logic Input", filed by Paul R. Schroeder and Robert J. Proebsting, on the same date of the present application, and assigned to the assignee of this invention, which application is hereby incorporated herein by reference. However, within the broader aspects of the invention, and conventional input buffer may be employed.

The address input buffer $AB_0$ is illustrated by way of example in FIG. 7. Address input $A_0$ is applied to terminal 31, typically as either +0.8 volts or +1.8 volts, representing logic levels from bipolar TTL circuitry. The trap address node 33 is momentarily brought high while latch address node 35 is low so that transistors 37, 39 and 41 are turned on. This results in a voltage near the voltage of address input $A_0$ being stored on nodes 43 and 45, and the reference voltage, typically +1.4 volts, being stored on node 47. After a short period, the "trap address" node 33 goes low, and the "latch address" node 35 goes high. The trapped voltages on nodes 45 and 47 are then capacitively boosted above the thresholds of transistors 49 and 61 by capacitors 63 and 65. The difference in conductance of transistors 49 and 61 due to the different voltages on nodes 45 and 47 is sensed by differential amplifier 64, the outputs of which are applied to a latch 66 which is set by the signal on the latch address input 35. This results in the complementary outputs $A_0$ and $\overline{A}_0$ assuming the appropriate logic levels. This circuitry is described and claimed in detail in the above reference application. The outputs of the latch 66 are both at low levels until occurrence of the latch clock signal as described in the above referenced application Ser. No. 513,091.

The true and complement outputs from each of the address buffers $AB_1$-$AB_5$ are applied in various combinations to the 32 decoders $D_1$-$D_{32}$ as will hereafter be described in greater detail. The true and complement outputs from buffer $AB_0$ are used to select one of the two row enable outputs from each of the 32 decoders $D_1$-$D_{32}$, as represented by lines $A_0$ and $\overline{A}_0$ in a FIG. 1, and are also used to control a multiplex circuit 40 to select which pair of outputs from two read/write amplifiers 42 are connected to a data I/O bus 44. Bus 44 is connected to a data input buffer 46 and to a data output buffer 48 generally in the manner disclosed in the above referenced co-pending application Ser. No. 513,091.

Four control signals designated chip select ($\overline{CS}$), row address strobe ($\overline{RAS}$), column address strobe ($\overline{CAS}$), and a read or write select signal $\overline{WRITE}$ are applied to inputs represented by bonding pads 50-53, respectively. Data input to the data input buffer 46 is applied to pad 54, and data output from the data buffer 48 leaves on pad 55. Four voltage supplies, including $V_{DD}$, $V_{BB}$, $V_{CC}$ and ground, are applied to pads 56-59, respectively, thus providing a total of sixteen external connections to the chip. In the present circuit, $V_{DD}$ is the maximum supply voltage and is equivalent to $V_{GG}$ in the above referenced application, and $V_{BB}$ is more analogous to $V_{DD}$ in the above application. These external connections go to the pins of a conventional hermetically sealed in-line package. Control logic, including the read/write amplifier 42, multiplex circuit 40, input buffer 46, and output buffer 48, together with internal clock generators to accomplish all neccesary functions including that described in the above co-pending application Ser. No. 513,091 is located primarily in the area defined by broken line 60. Bonding pads 50-59 are not necessarily located in the positions indicated in FIG. 1, however, and are illustrated only schematically. In this regard, it will be appreciated that the various control logic function must differ to some extent in order to operate the circuitry of the present invention but the necessary modifications are well within the purview of those ordinarily skilled in the art.

Each of the decoders $D_1-D_{32}$ is preferably substantially as illustrated in FIG. 3, which specifically illustrates decoder $D_{17}$. The decoder $D_{17}$ is comprised of transistors $Q_1-Q_5$ which are connected in parallel between a precharge node 100 and ground. The precharge node 100 is precharged to near $V_{DD}$ through a transistor $Q_6$ in response to a precharge signal $P_1$ on line 102, which goes to $V_{DD}$. Precharge node 100 is connected through transistor $Q_7$ to the gate of a transistor $Q_8$, through transistor $Q_9$ to the gate of transistor $Q_{10}$, and through transistor $Q_{11}$ to the gate of an enable line transistor $Q_{12}$. The gates of transistors $Q_8$ and $Q_{10}$ form row selected storage or control nodes $RN_{33}$ and $\overline{RN}_{34}$, respectively, and the gate of transistor $Q_{12}$ is column selected or control node CN.

The five sets of true and complement address signals $A_1-A_5$ and $\overline{A}_1-\overline{A}_5$ from the buffers $AB_1-AB_5$ are applied to lines 104-113 which extend vertically through all 32 of the decoders $D_1-D_{32}$. The outputs $A_0$ and $\overline{A}_0$ from buffer $AB_0$ are applied to circuitry 41 which produces $A_0(ROW)$ and $\overline{A}_0(ROW)$ signals during a row address cycle which are applied to thirty-two decoders $D_1-D_{32}$, and signals $A_0(COL)$ and $\overline{A}_0(COL)$ signals during the column address cycle which are applied to a multiplex circuit 40. The gates of the five transistors $Q_1-Q_5$ of each of the decoders is connected to a unique combination of five of the ten true and complement row address lines 104-113. For example, the gates of transistors $Q_1-Q_5$ may be connected to address lines $A_1$, $A_2$, $A_3$, $A_4$ and $A_5$, which is a binary representation of the number sixteen which is used in the decoder $D_{17}$. Except for the unique manner in which the gates of the transistors $Q_1-Q_5$ of each decoder are connected to the five pairs of address lines, the remainder of the circuit illustrated within the dashed outline in FIG. 3 is identical for all decoder circuits. Thus the nodes 100 may conveniently be called decode nodes.

A trap row decode signal TRD, a column enable signal CE, a row enable signal $REA_0$, and a complement row enable signal $\overline{REA}_0$ are applied to lines 114-117, respectively, which also extend through all 32 decoders. The row enable signals REA and $\overline{REA}_0$ are generated by suitable AND gates represented at 118 and 120 in response to the address signals $A_0(ROW)$ and row enable signal RE applied to terminal 122. Thus, either $REA_0$ or $\overline{REA}_0$ is high, and the other low, in complementary fashion in response to a row enable signal RE, produced at the appropriate time during the row cycle by the timing and control circuitry.

Line 116 for the $REA_0$ signal is connected to the drain node of transistor $Q_8$, and a row enable line $RE_{33}$ extends from the source node. The drain node of transistor $Q_{10}$ is connected to line 117 for the $\overline{REA}$ signal and the source node is connected to row enable line $RE_{34}$. The gate of transistors $Q_8$ and $Q_{10}$ form row control nodes $RN_{33}$ and $\overline{RN}_{34}$, respectively. The drain of transistor $Q_{12}$ is connected to line 115, which carries the column enable signal CE, and the source is connected to column enable line $CE_{17}$. The trap row decode line 114 is connected to the gates of transistors $Q_7$ and $Q_9$. Line 124 is connected to the gate of transistor $Q_{11}$ and is connected through transistor $Q_{13}$ to $V_{DD}$. The other end of line 124 is normally open. The gate of transistor $Q_{13}$ is also connected to $V_{DD}$ so as to permit node 124 to bootstrap by the stray capacitance of transistors $Q_{11}$ as will hereafter be described.

There are sixty-four row enable lines $RE_1-RE_{64}$ which extend from the thirty-two decode circuits $D_1-D_{17}$, and thirty-two column enable lines $CE_1-CE_{32}$. As is best illustrated in FIG. 2, the row enable lines $RE_1-RE_{64}$ extend parallel along the rows of cells, although only row enable signals $RE_{24}-RE_{40}$ from decoders $D_{12}-D_{21}$, respectively, are illustrated in FIG. 2. It will also be understood that although only columns 1-16 are illustrated, all row enable lines $RE_1-RE_{64}$ extend from the decoders $D_1-D_{32}$ completely across all sixty-four columns of the array. Column enable lines $CE_1-CE_{32}$ also extend from the respective decoders $D_1-D_{32}$ between the corresponding pairs of row enable lines extending from the same decoder. The row enable lines and the column enable lines extending horizontally from the decoders $D_1-D_{32}$ are typically metalized lines. It will be noted, however, that each of the horizontal metalized portions of each column enable line terminates when it reaches a certain column and makes contact with a conductor at a different level in the integrated circuit, usually a diffused region or a polycrystaline semiconductor layer, and then proceeds parallel to the columns to the appropriate sense amplifier as best illustrated in FIG. 2. For example, column lines $CE_{16}$ and $CE_{17}$ from decoders $D_{16}$ and $D_{17}$, respectively, transition from horizontal conductors to vertical conductors between the second and third columns and proceed downwardly and upwardly, respectively, to the row of sense amplifiers. Similary, column enable signals $CE_{15}$ and $CE_{18}$ transition between the sixth and seventh columns and proceed downwardly and upwardly, respectively, to the row of sense amplifiers. Each successive pair of column enable lines emanating from decoder circuits above and below the sense amplifier row, respectively, turns and proceeds toward the sense amplifiers after every four columns so that column enable lines $CE_{14}$ and $CE_{19}$ extend vertically through the array between columns 10 and 11, and column enable line $CE_{13}$ and $CE_{20}$ extend vertically between columns 14 and 15. This is continued until finally column enable lines $CE_1$ and $CE_{32}$ proceed to the sense amplifiers between columns 62 and 63, although this arrangement is not illustrated.

Each column enable line simultaneously enables two columns of the array as best seen in FIGS. 2 and 4. For example, column enable line $CE_{16}$ enables sense amps $SA_1$ and $SA_2$, while column enable line $CE_{17}$ enables sense amps $SA_3$ and $SA_4$. As previously described, two sets of true and complement data lines $DL_1$, $\overline{DL}_1$ $DL_0$ $\overline{DL}_0$ extend along all sixty-four of the sense amps $SA_1$-$SA_{64}$. The respective sense amps or "columns" are said to be enabled when the true and complement digit or sense lines are connected to the corresponding set of true and complement data lines. For example, the split digit lines $C_1$ and $\overline{C}_1$ are connected to data lines $DL_0$ and $\overline{DL}_0$ by transistors 150 and 152, and split digit lines $C_2$ and $\overline{C}_2$ are connected to the data lines $DL_1$ and $\overline{DL}_1$ by transistors 154 and 156, respectively, when column enable line $CE_{16}$ is active, i.e., high. Similarly, when column enable line $CE_{17}$ is active, transistor 158 and 160 connect column lines $C_4$ and $\overline{C}_4$ to data lines $DL_0$ and $\overline{DL}_0$, and transistors 162 and 164 connect column line $C_3$ and $\overline{C}_3$ to data lines $DL_1$ and $\overline{DL}_1$. Thus, it will be noted that data from the cells in two adjacent columns of the selected row are connected to the respective data line pairs $DL_0$, $\overline{DL}_0$ and $DL_1$, $\overline{DL}_1$, during each column address cycle in response to one column enable line $CE_1$-$CE_{32}$ being active. This data is sensed by the respective read/write amplifiers 42 of FIG. 1, which may function in the same manner as the sense amplifiers $SA_1$-$SA_{64}$, and the output from one of the amplifiers 42 selected by the multiplexer 40 in response to column address signals $A_0(-COL)$ and $\overline{A}_0(COL)$.

As mentioned, the horizontally extending row enable lines $RE_1$-$RE_{64}$ and horizontally extending portions of the column enable lines $CE_1$-$CE_{32}$ are typically formed by the metalized layer. The digit lines $C_1$-$C_{64}$ and $\overline{C}_1$-$\overline{C}_{64}$ are normally formed by diffused regions in the semiconductor substrate. The vertical portion of the column enable lines $CE_1$-$CE_{32}$ may also be formed by diffused regions connected to the metal horizontal positions of the lines by contact openings in the oxide or other insulating layers in the conventional manner. Where silicon gate technology is used to fabricate the device, as in the preferred embodiment of the present invention, the digit lines $C_1$-$C_{64}$ and $\overline{C}_1$-$\overline{C}_{64}$ may be diffused regions, and the vertical portions of the column enable lines $CE_1$-$CE_{32}$ formed by the polysilicon layer which forms the gates of transistors. The horizontal portions of the column enable lines and the row enable lines would still be metal. In either event, it is necessary to slightly spread the column lines to provide space for the vertical portions of the column enable lines. For this reason, it is preferable to have the column enable lines proceed from both above and below the row of sense amplifiers between the same columns in order to reduce the area which would otherwise be required.

The operation of the circuit 10 can best be understood by referring to FIG. 5, which is a timing diagram of those signals relating to the addressing functions only of the circuit 10. As previously mentioned, the chip 10 can be operated by the external control circuitry exactly in the same manner as described in the above referenced co-pending application Ser. No. 513,091, and in the commercial embodiment designed to be pin-for-pin compatible. Row address signals are applied to inputs $A_0$-$A_5$ at any time prior to a row address strobe signal $\overline{RAS}$ at terminal 51. During this precharge period, precharge signal $P_1$ is high so that transistor $Q_6$ is turned on, and node 100 is precharged to $V_{DD}$ less one threshold since all address lines 104-113 are low. During the precharge period, trap decode line 114 is driven to $V_{DD}$ so that row nodes $RN_{33}$ and $\overline{RN}_{34}$ are also precharged to $V_{DD}$ less one threshold. Before precharge $P_1$ goes high, column bootstrap node 124 is charged to $V_{DD}$ less one threshold, typically +10 volts for $V_{DD}$ is equal to +12 volts, as a result of transistor $Q_{13}$. Then when precharge signal $P_1$ goes high, node 124 is bootstrapped to about +16 volts by the stray capacitance of the thirty-two transistors $Q_{11}$ of the 32 decoders. As a result, column node $CN_{17}$ is also charged to $V_{DD}$ less one threshold. Upon the receipt of the row address strobe signal $\overline{RAS}$ at input 51, the precharge signal $P_1$, as represented by time line 200 falls from a high level to ground as represented by transition 200a, and the control logic generates the series of clock pulses necessary to automatically latch input buffers $AB_0$-$AB_5$ to produce logic signals $A_1$-$A_5$ as represented by transition 202a on time line 202 in FIG. 5. Since the precharge signal has gone low to turn transistor $Q_6$ off, and the true or complement outputs from each of the address buffers $AB_0$-$AB_5$ goes high, the node 100 of 31 of the 32 decoders is discharged to ground as a result of one or more of the transistors $Q_1$-$Q_5$ being turned on. As a result, the row nodes RN and $\overline{RN}$ and the column node CN of these 31 decoders are also discharged to ground. The node 100 for the selected one decoder in which all five transistors $Q_1$-$Q_5$ remains off remains high as do nodes RN and $\overline{RN}$, and column node CN. However, since column enable line CE is low, no column output is yet produced. The trap row decode line 114, as represented by time line 204, then falls from +12 volts to ground as represented by event 204a, thus turning transistors $Q_7$ and $W_9$ off. This results in trapping a high voltage on row nodes RN and $\overline{RN}$ of the addressed decoder, and a low voltage on row nodes RN and $\overline{RN}$ of all other decoders. At the same time, a row enable signal on node 122 causes either the REA, or $\overline{REA}_0$ lines 116 or 117 to go high as represented by 206a on time line 206 of FIG. 5. As a result, only one row enable line goes high, with all sixty-three other remaining low, thus enabling only those cells in the one enabled row. For example, if address line $A_0$ is high, and node 100 of decoder $D_{17}$ is high, indicating that decoder 17 was addressed, then row enable line $RE_{33}$ will go high and all of the other row enable lines $RE_1$-$RE_{32}$ and $RE_{34}$-$RE_{64}$ will stay low. This results in the binary data being read from cells $R_{33}C_1$ through $R_{33}C_{64}$ by the sense amps $SA_1$-$SA_{64}$. The address lines 104-113 that were high will then return low as represented by event 202b, typically at the same time that lines 204 and 206 make transitions 204a and 206a. These three events occur automatically a predetermined period of time after the row address strobe $\overline{RAS}$. The precharge signal also again goes high as represented by event 200b after events 202b, 204a and 206a have been completed, thus again precharging the nodes 100 of all decoder circuits $D_1$-$D_{32}$, as well as the column node CN, of all 32 decoders.

It will be noted that the bootstrap node 124 for the transistors $Q_{11}$, which is represented by line 208, transitions from about +16 volts down to about +10 volts, as represented at event 208a, as a result of the discharge of 31 of the 32 nodes 100. However, node 124 is driven back to +16 volts, as represented by event 208b as the 31 nodes 100 are again precharged as the transistors $Q_6$ are turned on at event 200b. Consequently, the nodes CN of all decoders $D_1$-$D_{32}$ can be fully charged to the same potential as the nodes 100, which $V_{DD}$ less one threshold when the precharge signal is around $V_{DD}$. There are two advantages to having node 124 transition as above when compared to just connecting node 124 to $V_{DD}$ as in the conventional manner. First, during precharge, node CN more closely follows node 100 high due to a voltage above $V_{DD}$ on node 124. Second, after discharge of 31 or 32 decoders, node 124 is one threshold below $V_{DD}$ so that transistor $Q_{11}$ is off in the selected decoder so long as node 100 was precharged to two thresholds below $V_{DD}$ or greater. This prevents the bootstrap node $CN_{17}$ from being discharged through transistor $Q_{11}$ on the selected decoder when the column enable line goes high and bootstraps node $CN_{17}$ above $V_{DD}$.

As previously mentioned, a row address strobe automatically causes one of the row enable lines $RE_1$-$RE_{64}$ to go high and all others to remain low. The control circuit logic also automatically causes each of the sense amps $SA_1$-$SA_{64}$ to sense the logic state of the storage cell $R_xC_y$ and to switch the respective digit lines C and $\overline{C}$ in accordance with the logic level sensed. As a result of reading the cell, the true column line $C_y$ of each sense amplifier will be at one logic level and the corresponding complement column line $\overline{C}_y$ will be at the other logic level.

Immediately after the input buffers $AB_0$-$AB_5$ were latched up for the row address cycle, the signals on address inputs $A_0$-$A_5$ can be changed from those representing the row address of the desired cell to those representing the column address of the desired cell. Then in response to a column address strobe on input 52, the precharge line 102 again transitions from high to low, as represented by event 200c to again isolate the nodes 100 of all 32 decoders, followed by the appropriate decoder address lines 104-113 going high when the voltage on address inputs $A_0$-$A_5$ are sampled and the buffers $AB_0$-$AB_5$ latched up, as represented by event 202c. This again discharges 31 of the 32 nodes 100, as well as the corresponding column nodes CN. However, since transistors $Q_7$ and $Q_9$ were off prior to the precharge cycle 200b, all but one of the thirty-two row nodes RN and all but one of the thirty-two row nodes $\overline{RN}$ remain low. Both the RN and the $\overline{RN}$ nodes from the previously selected row decoder remain high but only one of the two signals $REA_0$ and $\overline{REA}_0$ is high so only one row remains active. The one column node CN that is held holds the corresponding transistor $Q_{12}$ on, so that when column enable clock line 115 goes high, as represented by event 210a on time line 210, the corresponding column enable line CE will also go high and thus become "active".

When the column enable line goes high, the true and complement column sense lines $C_y$ and $\overline{C}_y$ and $C_{y+1}$ and $\overline{C}_{y+1}$ of the two sense amplifiers addressed by the column enable line are connected to the respective pair of data lines $DL_0$ and $\overline{DL}_0$ and $DL_1$ and $\overline{DL}_1$. For example, if column enable line $CE_{16}$ goes high as a result of the column address signals, the column sense lines $C_1$ and $\overline{C}_1$ are connected to data lines $DL_1$ and $\overline{DL}_0$ and column sense lines $C_2$ and $\overline{C}_2$ are connected to data lines $DL_1$ and $\overline{DL}_1$ as a result of transistors 150, 152, 154, and 156 being turned on. Since all other column enable lines remain low, no other column sense lines are connected to the data lines.

One of the two read/write amplifiers 42 of FIG. 1 detects the states of data lines $DL_0$ and $\overline{DL}_0$ while the other detects the states of $DL_1$ and $\overline{DL}_1$. The multiplex circuit 40 of FIG. 1 selects the output from one of the read/write amplifiers dependent upon lines $A_0$ and $\overline{A}_0$ from buffer $AB_0$ during the column address period. The amplifier selected by the multiplex circuit 40 is connected to the data bus 44 which is connected to the data input buffers 46 and the data output buffer 48. As a result, the address function is the same whether reading or writing data. Further, since the column address function is in response to a column address strobe, a number of storage cells in a common addressed row can be sequentially addressed without repeating the row addressing sequence.

In the preferred embodiment of the invention illustrated, a single decode node is connected to activate either of two row enable lines which are selected by one address input and each decode node is also corrected to activate one column enable line which in turn enables two sense amplifiers the outputs of which are selected by one address input. It will be appreciated, however, that the number of decode nodes could be doubled and one row enable line and one column enable line provided for each node, or any other convenient combination of decode nodes and row and column enable lines utilized.

An important advantage of this present invention not readily evident is that dynamic sense amplifiers each having balanced true and complement digit lines may be used because the column address information is available on each side of each sense amplifier at the true and complement data lines. This permits data to be written into either half of the memory array even though a dynamic sense amplifier is used because the sense amplifiers are not used in the wire operation, only the read/write amplifier 42.

Although preferred embodiments of the invention have been described in detail, it is to be understood that various changes, substitutions and alterations can be made therein without departing from the spirit of the invention as defined by the appended claims.

What is claimed is:

1. An integrated circuit chip including a decode circuit comprising:
   at least two input lines to the decode circuit for a corresponding number of binary address signals,
   a plurality of decode nodes,
   a like plurality of first circuit means for producing a decode signal on a selected one of the decode nodes in response to each combination of binary address signals applied to the input lines,
   a like plurality of second circuit means for storing the decode signal from each of the decode nodes, each second circuit means having an output isolatable from the respective decode node, and
   a like plurality of control circuit means for causing the first and second circuit means to produce a first decode signal on one of the decode nodes in response to a first set of address signals applied to the input lines and to store the decode signal produced therefrom in the respective second circuit means, and then to produce a second decode signal on one of the decode nodes in response to a second set of address signals applied to the input line.

2. The integrated circuit chip of claim 1, further comprising:

a plurality of memory cells arrayed in rows and columns, row enable means for enabling the row of cells represented by the first decode signal while stored in the storage means, and column enable means for enabling the column of cells represented by the second decode signal while the first decode signal is stored in the storage means.

3. A decoder circuit for transmitting an enable signal to a row line of a semiconductor memory in response to receipt of an address signal which is transmitted through a plurality of address lines as first and second voltage states, the circuit functioning during each memory cycle in response to at least one precharge signal, the decoder circuit comprising:

means for precharging a first node to the first state in response to a first precharge signal;

means for driving the first node to the second state upon receipt of the address signal when the received address signal is at the first state for at least one of the address lines;

means for precharging a second node to the first state in response to a second precharge signal and for driving the second node to the second state when the first node is at the second state; and means for transmitting the enable signal to the row line when the second node is at the first state.

4. A method for decoding address data in a semiconductor memory having a row and column lines, the method comprising the steps of:

transmitting row selection address bits through a group of address lines to a decode circuit, each of the address lines connected to a respective input terminal of the decode circuit;

generating a first state at an output terminal of the decode circuit when the decode circuit is selected by the address bits received at the input terminals thereof;

transmitting column selection address bits through the address lines after transmission of the row selection address bits therethrough; and inhibiting the signal at the output terminal of the decode circuit from changing state at the time of receipt of the column selection address bits at the input terminals of the decode circuit.

5. A method for transmitting a row enable signal to a row line of a semiconductor memory in response to receipt of a row adress signal which is transmitted through a plurality of address lines as first and second voltage states, the method functioning in response to at least one precharge signal, comprising the steps of:

precharging a first node to said first state in response to said precharge signal;

driving said first node to said second state upon receipt of said first state of any one of said address lines;

precharging a second node to said first state in response to a precharge signal;

driving said second node to said second state when said first node is at said second state; and transmitting said row enable signal to said row line when said second node is at said first state.

* * * * *